United States Patent [19]
Terauchi et al.

[11] Patent Number: 6,060,751
[45] Date of Patent: May 9, 2000

[54] SEMICONDUCTOR DEVICE HAVING ELEMENT ISOLATION

[75] Inventors: Mamoru Terauchi, Yokosuka; Manabu Kamikokuryou, Yokohama, both of Japan

[73] Assignee: Kabushiki Kaisha Toshiba, Kawasaki, Japan

[21] Appl. No.: 08/676,965

[22] Filed: Jul. 8, 1996

[30] Foreign Application Priority Data

Jul. 7, 1995 [JP] Japan ................... 7-172330

[51] Int. Cl.[7] .................. H01L 27/01; H01L 31/0392
[52] U.S. Cl. ................. 257/354; 257/349; 257/394
[58] Field of Search .................... 257/347, 349, 257/354, 394, 400, 544, 547; 438/149

[56] References Cited

U.S. PATENT DOCUMENTS

| 5,294,821 | 3/1994 | Iwamatsu | 257/351 |
| 5,359,219 | 10/1994 | Hwang | 257/351 |

FOREIGN PATENT DOCUMENTS

| 5-299437 | 11/1993 | Japan | 257/349 |
| 06-204334 | 7/1994 | Japan . | |

Primary Examiner—Mahshid Saadat
Assistant Examiner—George C. Eckert, II
Attorney, Agent, or Firm—Foley & Lardner

[57] ABSTRACT

A semiconductor device comprises a composite substrate comprising a semiconductor substrate and a semiconductor layer on said semiconductor substrate with a dielectric layer interposed therebetween; a plurality of element regions formed in the semiconductor layer and each having formed a field effect transistor including a source region and a drain region of a first conduction type; and an impurity-diffused region of a second conduction type which is formed directly under an element isolating film isolating respective elements. The impurity-diffused region having the opposite conduction type and formed under the element separating film restrain formation of parasitic transistors and prevent a decrease in threshold value.

The semiconductor device can be fabricated by preparing a SOI substrate; making a mask on the composite substrate and having an aperture on a location to be used for isolating elements; using the mask to form both an element isolating insulation film and first conduction type impurity-diffused regions in locations corresponding to outer marginal portions of elements to be made; and forming second conduction type impurity-diffused regions on the semiconductor layer as sources of drains of the elements.

10 Claims, 6 Drawing Sheets

SEMICONDUCTOR DEVICE HAVING ELEMENT ISOLATION

BACKGROUND OF THE INVENTION

This invention relates to a semiconductor device and a method of manufacturing the same and, in particular, to an element-isolated semiconductor device and a method of manufacturing the same.

Conventionally known is a semiconductor device using a composite substrate in which a silicon layer is positioned on a silicon substrate with disposing a silicon oxide or other dielectric layer therebetween. Composite substrates of this type are called, in general, SOI (silicon on insulator).

For fabricating semiconductor devices using a SOI substrate, the LOCOS (local oxidation of silicon) method, which is one of selective oxidation methods, or the field shield method is used as an element isolating method.

FIGS. 7 and 8 illustrate a structure of a semiconductor device in which elements are isolated by the LOCOS method. FIG. 7 is a plan view, and FIG. 8 is a cross-sectional view taken along the II–II' line of FIG. 7.

As shown in FIGS. 7 and 8, an SOI substrate is made up of a dielectric layer 602 formed on a semiconductor substrate 601 and a semiconductor layer 603 formed on the dielectric layer 602. The semiconductor layer 603 has formed n-regions (n$^+$-regions or n$^-$-regions) 605, 606 behaving as source and drain regions at opposite sides of an i-region (intrinsic region) behaving as an active region to make up a transistor element region 620. The semiconductor layer 603 also has formed other n-regions (n$^+$-regions or n$^{31}$-regions) 608, 609 at opposite sides of an i-region 607 to make up another transistor element region 621. The remainder region of the semiconductor layer 603 other than the element regions 620, 621 is a field oxidation film 610 made by the LOCOS method for isolating the elements.

Deposited on the semiconductor layer 603 is an insulation film 611. Formed above the i-regions 604, 607 are gate electrodes 612, 613 via the insulation film 611.

As shown in FIG. 8, an inter-layer insulation film 614 overlies the insulation film 611 and the gate electrodes 612, 613. Contact holes extend through the inter-layer insulation film 614 and the insulation film 611 to expose the n-regions 605, 606, 608 and 609. A conductive material is deposited in the contact holes to form electrodes 615, 616, and so on.

This structure having the field oxidation film 610 as the element isolation film can prevent conduction between the element region 620 and the element region 621 through n-type conduction channels (namely, conduction between the n-regions 605, 606 and the n-regions 608, 609) and can isolate the elements from each other.

In the conventional semiconductor device shown in FIGS. 7 and 8, the field oxidation film 610 is made by oxidizing the semiconductor layer 603 by the LOCOS method. It results in producing outer marginal portions around the element regions 620 and 621, which gradually become thinner toward the extremities, as shown at 620a and 621a in FIGS. 8 and 9. That is, as the outer marginal region 620a or 621a becomes thinner (as a portion of the outer marginal region 620a or 621a is nearer to its extremity), it becomes more distant from the gate electrode 612 or 613 and less controlled by them.

There also occurs a phenomenon called segregation in which the field oxidation film absorbs boron atoms from the p-regions 620a and 621a in the outer marginal portions during oxidation. As a result, the outer marginal portions become liable to invert due to a decrease in impurity concentration, and these portions result in behaving as parasitic transistors.

Therefore, in the conventional semiconductor device shown in FIGS. 7 and 8, the threshold value drops in the outer marginal portions 620a, 621a, which permits the parasitic transistors to turn on before the true transistors are turned on, and causes a leak current to flow, which makes ON/OFF control of the transistors by the gate electrodes 612, 613 difficult. The leak current appears as a leak current in the element regions 62O, 613, namely, as the leak current $i_1$ between the n-region 605 and the n-region 606 and the leak current $i_2$ between the n-region 608 and the n-region 609.

The leak currents $i_1$ and $i_2$ may occur in any semiconductor device having a film that becomes thinner in outer marginal portions of element regions also when another method is used for isolation of elements in lieu of the LOCOS method.

The leak currents $i_1$, $i_2$ could be prevented by using the field shield method in lieu of the LOCOS method for element isolation. It, however, complicates the manufacturing process and increases the manufacturing cost of semiconductor devices.

SUMMARY OF THE INVENTION

It is therefore an object of the invention to provide a semiconductor device and its manufacturing method which precludes formation of parasitic transistors and a leak current, and promises stable control.

According to a first aspect of the invention, there is provided a semiconductor device having:

- a composite substrate having a semiconductor substrate and a semiconductor layer on the semiconductor substrate with a dielectric layer interposed therebetween;
- a plurality of element regions provided in a semiconductor layer and each having a field-effect transistor having a source and a drain of a first conduction type; and
- an impurity-diffused region formed directly under an element isolation region formed between adjacent two of said element regions and having a second conduction type opposite from the first conduction type.

According to the second aspect of the invention, there is provided a semiconductor device having:

- a composite substrate comprising a semiconductor substrate, and a semiconductor layer on the semiconductor substrate with a dielectric layer interposed therebetween;
- a plurality of element regions provided in the semiconductor layer and each having a field-effect transistor having a source and a drain of a first conduction type;
- an element isolating insulation film made by substitution in part of the semiconductor layer surrounding the element regions;
- first impurity-diffused regions of a second conduction type formed in outer marginal portions of the element regions in the semiconductor layer, the outer marginal portions being adjacent to the element isolating insulation film; and
- a second impurity-diffused region of the second conduction type formed along a selective surface portion of the semiconductor substrate that extends under the element isolating insulation film lying between the element regions and under the marginal portions of the element regions adjacent to the element isolating insulation film.

According to the third aspect of the invention, there is provided a method for manufacturing a semiconductor device, having the steps of:

preparing a composite substrate comprising a semiconductor substrate, and a semiconductor layer on the semiconductor substrate with a dielectric layer interposed therebetween;

forming a mask on said composite substrate, the mask having an aperture on a location to be used for isolating elements to be made;

forming an element isolating insulation film using the mask and forming first and second intpurity-diffused regions of a first conduction type in outer edge portions of element regions to be formed in the semiconductor layer and in a selected surface portion of the semiconductor substrate;

forming gate electrodes on selective portions of the semiconductor layer, and forming third impurity-diffused regions of a second conduction type in selective portions of the semiconductor layer for making the elements, the third impurity-diffused regions behaving as sources and drains of the elements.

According to the fourth aspect of the invention, there is provided a method for manufacturing a semiconductor device, having the steps of:

preparing a composite substrate comprising a semiconductor substrate, and a semiconductor layer on the semiconductor substrate with a dielectric layer interposed therebetween;

forming a mask on the composite substrate, the mask having an aperture on a location to be used for isolating elements;

implanting and diffusing ions of a first conduction type into the semiconductor layer and onto the surface of the semiconductor substrate by using the mask to form first and second impurity-diffused regions of a first conduction type in outer edge portions of element regions to be formed in said semiconductor layer and in a selected surface portion of the semiconductor substrate;

forming an element isolating insulation film in said location in context with the dielectric layer by oxidation under the existence of the mask;

removing the mask and forming an insulation film on the semiconductor layer;

forming gate electrodes on the insulation film; and forming a third impurity-diffused regions of a second conduction type in the semiconductor layer in self-alignment with the gate electrodes, the third impurity-diffused regions behaving as sources and drains of the elements.

According to fifth aspect of the invention, there is provided a method for manufacturing a semiconductor device, having the steps of:

preparing a composite substrate comprising a semiconductor substrate, and a semiconductor layer on the semiconductor substrate with a dielectric layer interposed therebetween;

forming a mask on the composite substrate, the mask having an aperture on a location to be used for isolating elements;

forming an element isolating insulation film in said location in contact with the dielectric layer by oxidation using the mask;

removing the mask, and implanting and diffusing ions of a first conduction type into the semiconductor layer directly under the element isolating insulation film and a surface portion of said semiconductor substrates to form first and second impurity-diffused regions of a first conduction type in outer edge portions of element regions to be formed in the semiconductor layer and in a selected surface portion of the semiconductor substrate;

forming an insulation film on said semiconductor layer;

forming gate electrodes on the insulation film; and forming a third impurity-diffused regions of a second conduction type in the semiconductor layer in self-alignment with said gate electrodes, the third impurity-diffused regions behaving as sources and drains of the elements.

DESCRIPTION OF THE PREFERRED EMBODIMENTS

Explained below are a semiconductor device and its manufacturing methods taken as preferred embodiments of the invention.

Figure 1:
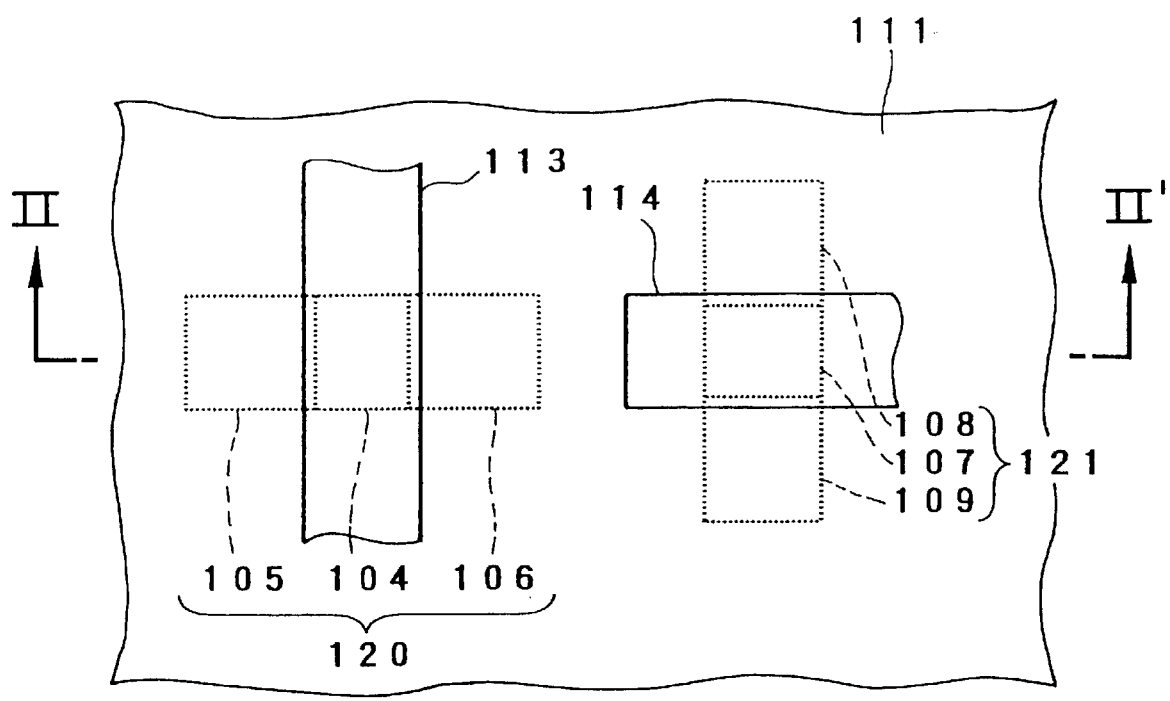
FIG. 1 is a plan view showing a semiconductor device embodying the invention.
Figure 2:
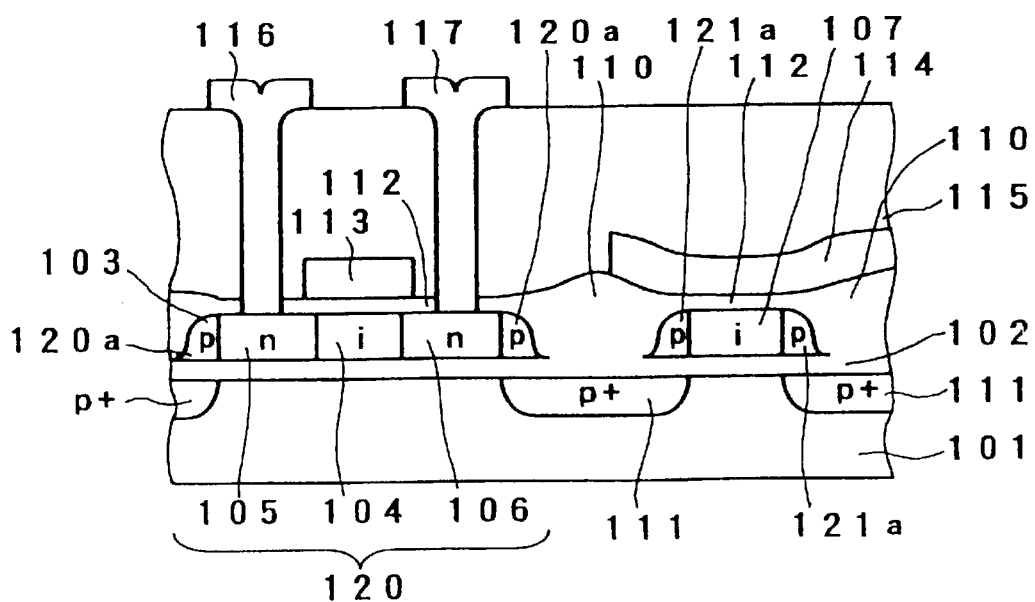
FIG. 2 is a cross-sectional view taken along the II–II' line of FIG. 1.

FIGS. 1 and 2 illustrate a construction of a semiconductor device according to an embodiment, in which FIG. 1 is a plan view and FIG. 2 is a cross-sectional view taken along the II–II' line of FIG. 1.

As illustrated in the drawings, a silicon oxide film (which corresponds to the dielectric layer of the invention) 102 is formed on a single crystal silicon substrate (which corresponds to the semiconductor substrate of the invention) 101. Formed on the silicon oxide film 102 is a single crystal silicon layer (corresponding to the semiconductor layer of the invention) 103. The single crystal silicon substrate 101, silicon oxide film 102 and single crystal silicon layer 103 constitute a SOI substrate.

The single crystal silicon layer 103 has formed n-regions ($n^{30}$ -regions or $n^{31}$ -regions) 105, 106 at opposite sides of an i-region 104, and n-regions ($n^{30}$ -regions or $n^{31}$ -regions) 108, 109 at opposite sides of an i-region 107. The regions 104 to 106 and the regions 107 to 109 constitute, respectively. n-channel MOSFETs (corresponding to the element regions of the invention) 120, 121. The remainder portion of the single crystal silicon layer 103 other than the regions 120, 121 is made up of a field oxidation film (corresponding to the element isolation region of the invention) 110. A p-type impurity is introduced into outer marginal portions of the n-channel MOSFETs 120, 121 (i.e. regions 104 to 109) to form p-type impurity regions 120a, 121a (corresponding to the first impurity regions of the invention).

Apart from these, a p-type impurity is introduced into a surface portion of the single crystal silicon substrate 101 underlying the p-type impurity regions 120a, 121a and the field oxidation film 110 to form a $p^{3o}$ -region 111 (corresponding to the second impurity region of the invention).

In the embodiment shown here, the impurity concentration of the single crystal silicon layer 103 is $10^{12}$ cm$^{-3}$ to $10^{18}$ cm$^{-3}$ in the i-regions 104, 107, $10^{20}$ cm$^{-3}$ or more in the n$^+$-regions, and $10^{18}$ cm$^{-3}$ to $10^{19}$ cm$^{-3}$ in the n$^-$-regions. The imparity concentration of the p-type impurity regions 120a, 121a is $10^{15}$ cm$^{-3}$ to $10^{19}$ cm$^{-3}$. The impurity concentration of the p$^+$-region 111 is preferably $10^{20}$ cm$^{-3}$ or more.

Formed on the i-regions 104, 107 are gate electrodes 113, 114 via an insulation film 112 made of silicon oxide, for example, to also serve as an interconnection.

The surfaces of the insulation film 112 and gate electrodes 113, 114 are covered by an inter-layer insulation film 115 made of, for example, silicon oxide. Contact holes extend through the inter-layer insulation film 115 and the insulation film 112 to expose the n-regions 105, 106, 108, 109, and a metal or other conductive material is deposited in the contact holes to form electrodes 116, 117 (not shown in FIG. 1).

According to the embodiment, potentials of the p$^+$-region 111 and of the p-type impurity regions 120a, 121a can be controlled by applying zero or negative voltage (for example, −3 V to 0 V) to the p'-type impurity region 111. In the case that the impurity region is of n'-type, a positive power supply voltage is applied to the impurity region 111.

Thus, the potentials of the p$^+$-region 111 and p-type impurity regions 120a, 121a can be controlled to restrain generation of parasitic transistors and to prevent leak currents which would otherwise occur between the n-region 105 and the n-region 106 (i.e. between the source and the drain of the n-channel MOSFET 120) and between the n-region 108 and the n-region 109 (i.e. between the source and the drain of the n-channel MOSFET 121).

Next explained is a method, taken as an embodiment, for manufacturing the semiconductor device according to the above embodiment.

FIGS. 3A to 3D are cross-sectional views showing different steps of the process for fabricating the semiconductor device according to the invention.

First prepared is a SOI substrate having a single crystal silicon layer 103 whose impurity concentration ranges from $10^{12}$ cm$^{-3}$ to $10^{16}$ cm$^{-3}$. A mask pattern 201 is formed on the SOI substrate by patterning a resist in the same manner as the conventional LOCOS method (see FIG. 3A). Boron (B) ions are introduced into selective surface portions of the single crystal silicon substrate 101 via the mask pattern 201. The resulting distribution of the implanted ion concentration trails a tail along the surface as shown in FIG. 4.

Figure 4:
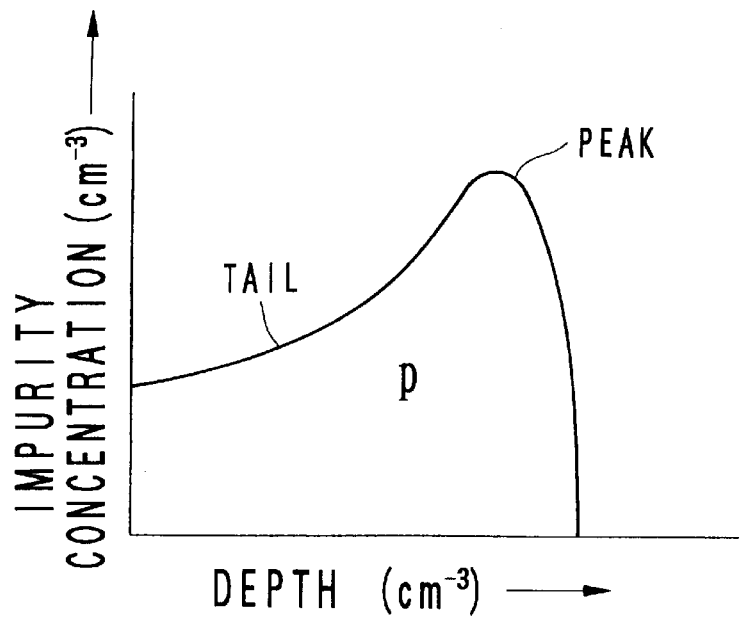
FIG. 4 is a graph showing a distribution of impurity concentration obtained by ion implantation into a conventional semiconductor device.
Figure 5:
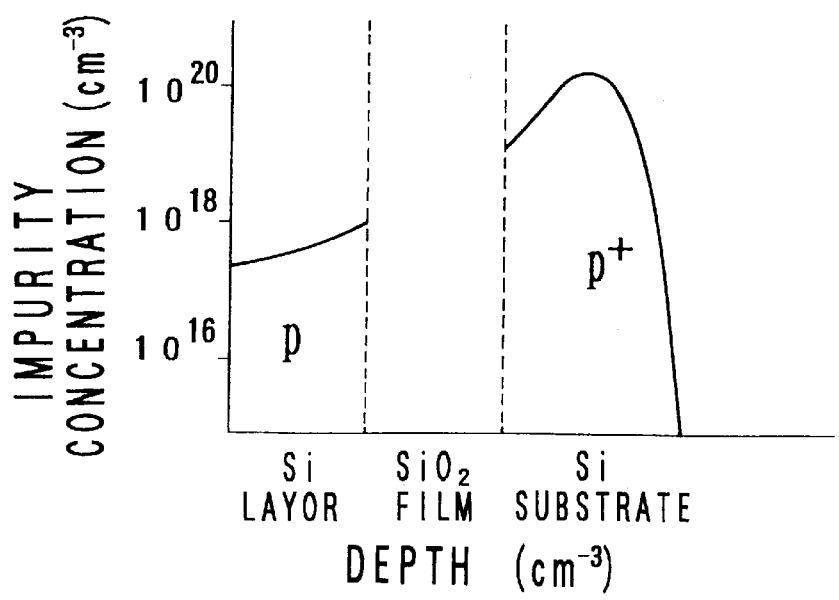
FIG. 5 is a graph of a distribution of impurity concentration appearing when p-type impurity regions and a p-type impurity region are formed as shown in FIG. 2.

In the case of this embodiment, since the silicon oxide film 102 is interposed between the single crystal silicon substrate 101 and the single crystal silicon layer 103, ion implantation providing the concentration distribution shown in FIG. 4 results in the impurity concentration distribution as shown in FIG. 5. That is, by introducing ions into the single crystal silicon substrate 101 to form the p$^+$-type impurity region 111, the p-type impurity region 202 in the single crystal silicon layer 103 can be made simultaneously.

Preferable impurity concentrations are 10 $^{15}$ cm$^{-3}$ to $10^{19}$ cm$^{-3}$ in the p-type impurity region 202 and $10^{20}$ cm$^{-3}$ or more in the p$^-$-type impurity region 111.

The impurity concentration distribution referred to above can be obtained by appropriate adjustment of the dose and the acceleration voltage during ion implantation.

Figure 3A:
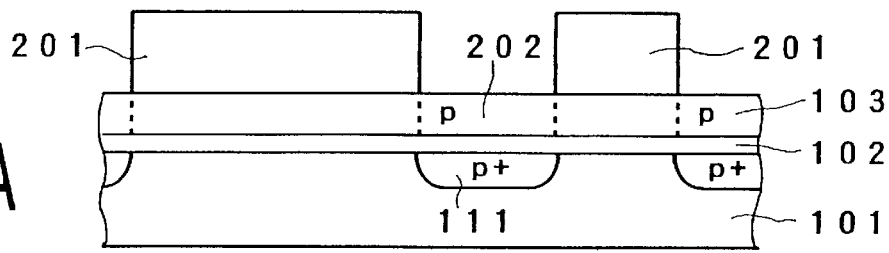
FIGS. 3A to 3D are cross sectional views showing different steps of a method for manufacturing the semiconductor device shown in FIGS. 1 and 2.
Figure 3B:
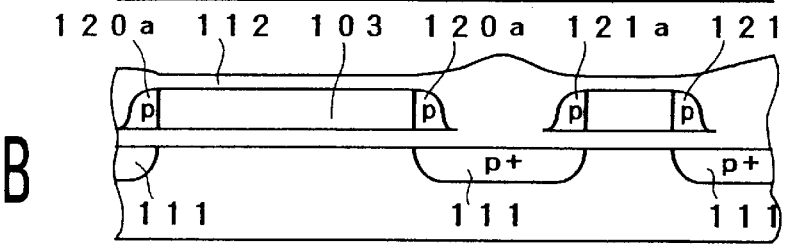

Then follows selective oxidation by the conventional LOCOS method using the mask pattern 201 (see FIG. 3B). It results in selectively making the field oxidation film 110 in the single crystal silicon layer 103 and the p-type impurity regions 120a, 121a in outer marginal portions of the single crystal silicon layer 103 outside the selective-oxidized portions.

Next formed on the single crystal silicon layer 103 is the insulation film 112 by thermal oxidation, for example. Then, after a gate material is deposited on the entire surface of the insulation film 112 by the CVD method, for example, the gate material is patterned into gate electrodes 113, 114 by employing conventional lithography and reactive ion etching technologies (see FIG. 3C).

Figure 3C:
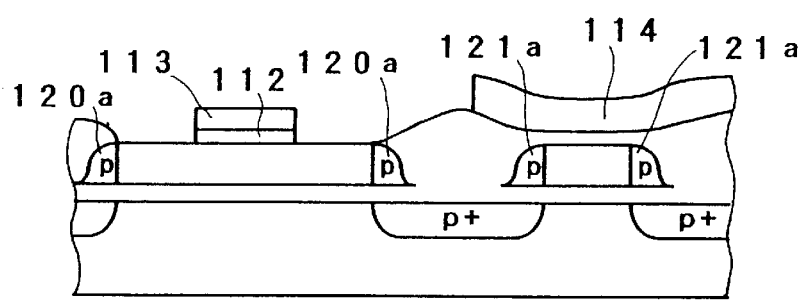
Figure 3D:
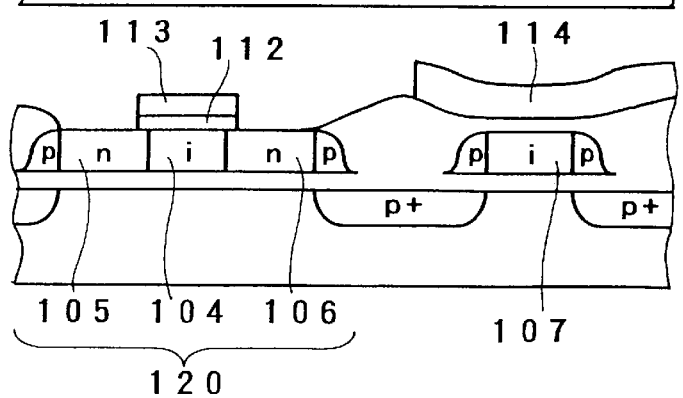

After that, by ion implantation of arsenic (As) or phosphorous (P), n-regions (n$^+$-regions with an impurity concentration of $10^{20}$ cm$^{-3}$ or more or n$^+$-regions with an impurity concentration from $10^{20}$ cm$^{-3}$ to $10^{19}$ cm$^{-3}$) 105, 106, 108, 109 are formed (see FIG. 3D).

Finally, the inter-layer insulation film 115 is formed by using the CAD method, for example, followed by opening contact holes in the inter-layer insulation film 115 to expose the n-regions 105, 106, 108, 109 by employing conventional lithography and reactive ion etching technologies, etc., further followed by making electrodes 116, 117 by deposition of a metal or other conductive material in the contact noles, which completes the semiconductor device as shown in FIGS. 1 and 2.

According to the manufacturing method according to this embodiment, both the ion implantation for making the p$^+$-type impurity regions 111 and the ion implantation for making the p-type impurity regions 120a, 121a can take place simultaneously. It of course contributes to omission of some steps from the manufacturing process, and hence contributes to decreasing the manufacturing cost.

In the case that impurities are implanted into the i-regions 104 and 107 in order to control a threshold voltage of a MOSPET, such implantation preferably performed after the process step shown in FIG. 33.

Next explained is another manufacturing method taken as a further embodiment of the invention.

FIGS. 6A through 6D are cross-sectional views showing different steps in the manufacturing method taken here.

Here again, the manufacturing method uses as the SOI substrate the single crystal silicon layer 103 with an impurity concentration ranging from $10^{12}$ cm$^{-3}$ to $10^{12}$ cm$^{-3}$.

Figure 6:
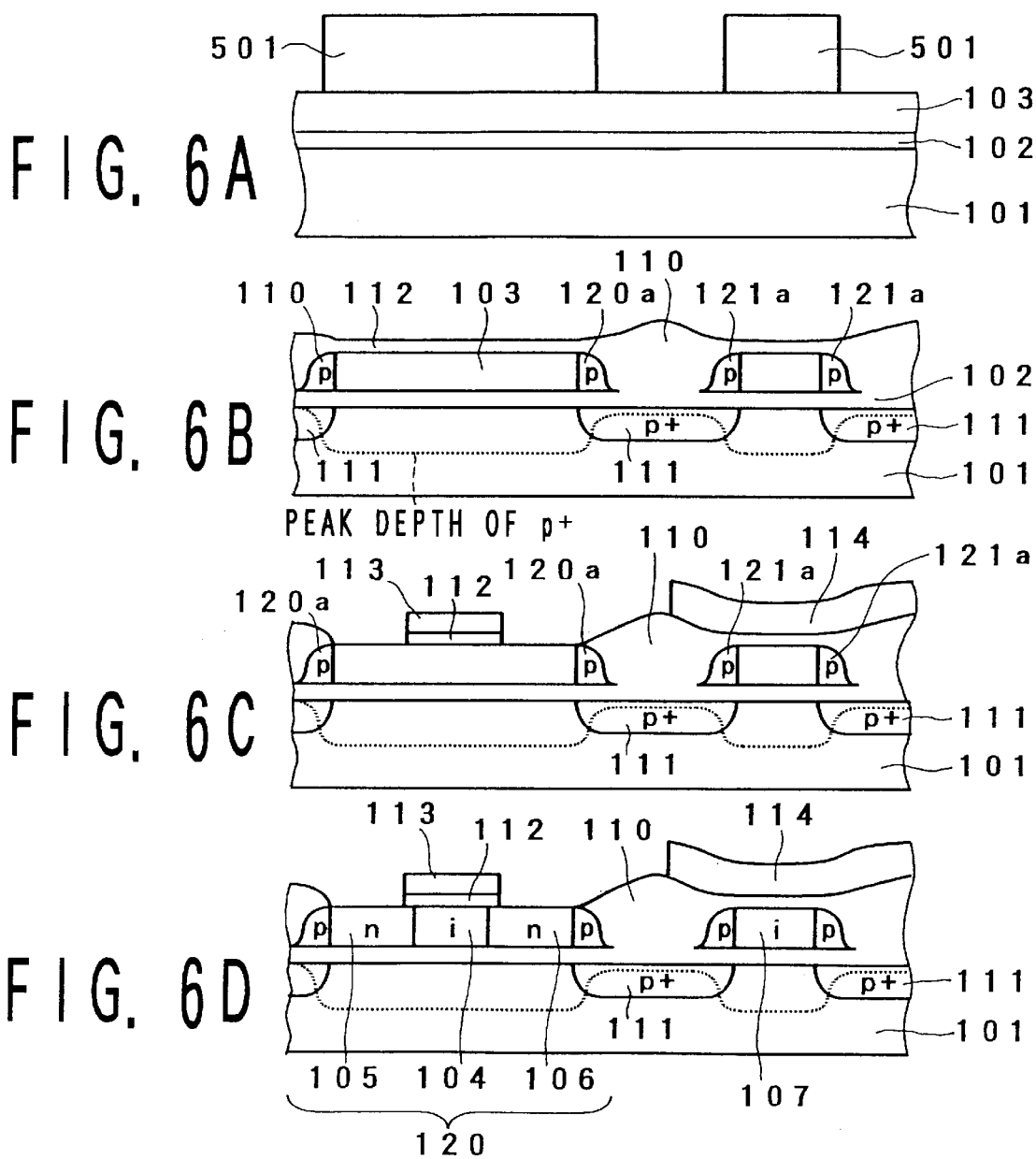
FIGS. 6A to 6D are cross-sectional views showing different steps of another method for manufacturing the semiconductor device shown in FIG. 2.

First formed on the SOI substrate is a mask pattern by substantially the same process as the conventional LOCOS method (see FIG. 6A). By using the mask pattern 501, selective oxidation is performed using the conventional LOCOS method. As a result, the field oxidation film 110 is selectively formed in the single crystal silicon layer 103. The mask pattern 501 is removed here.

Then follows ion implantation of boron (B) onto the entire surface of the SOI substrate while adjusting the ion acceleration speed for the implantation such that the peak depth appearing under the central portion of the field oxidation film 110 be within 0.1–0.2 μm from the surface toward the interior of the single crystal silicon substrate 101. Thus, in the regions having the field oxidation film 110, the p$^+$-type region 111 is formed along the surface of the single crystal silicon substrate 101.

Other p$^-$-type impurity regions are also made in other portions of the single crystal silicon substrate 101 not having the field oxidation film 110 on it. However, since the single crystal silicon layer 103 is thinner than the field oxidation film 110, the latter p$^+$-type impurity regions are formed at much deeper positions in the single crystal silicon substrate 101 as shown with the broken line in FIG. 6B. Therefore, the latter p$^+$-type impurity regions do not affect the behaviors of the n-channel MOSFETs (see FIGS. 1 and 2) which are made later.

Since the distribution of impurity concentration explained above with reference to FIG. 5 can be obtained in the portions where the field oxidation film 110 is formed, the p-type impurity regions 120a and 121a are formed simultaneously in the single crystal silicon layer 103 (see FIG. 6B).

Preferable values of impurity concentrations in this process are from $10^{15}$ cm$^{-3}$ to $10^{14}$ cm$^{-3}$ in the p-type impurity region 110, and not less than $10^{20}$ cm$^{-3}$ in the p$^+$-type impurity region 111. These impurity concentrations can be realized by appropriate adjustment of the dose and the accelerating voltage during ion implantation.

After that, in the same manner as explained with reference to FIG. 3C, the insulation film 112 is formed on the single crystal silicon layer 103, and the gate electrodes 113, 114 are made (see FIG. 6C).

Then, in the same manner as shown in FIG. 3D, n-regions (n$^+$-regions with an impurity concentration not less than $10^{20}$ cm$^{-3}$ or n$^-$-regions with an impurity concentration in the range from $10^{18}$ cm$^{-3}$ to $10^{19}$ cm$^{-3}$) 105, 106, 108, 109 are formed in the single crystal silicon layer 103 (see FIG. 6D). Concurrently, the other regions not implanted with ions make the i-regions 104, 107.

Finally, in the same manner as the process shown in FIGS. 3A to 3D, the electrodes 116, 117 are formed to complete the semiconductor device as shown in FIGS. 1 and 2.

Also the manufacturing method explained above executes simultaneous ion implantation for making the p$^+$-type impurity region 111 and ion implantation for making the p-type impurity regions 120a, 121a. It contributes to a reduction in number of steps of the manufacturing process and to a reduction of the manufacturing cost of semiconductor devices.

Figure 7:
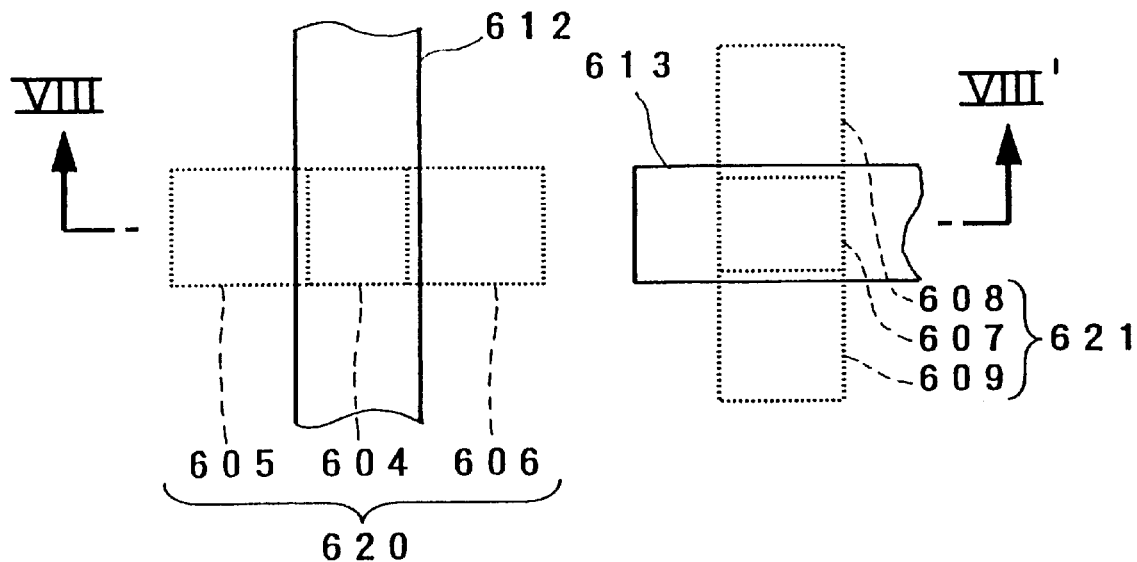
FIG. 7 is a plan view of a conventional semiconductor device.
Figure 8:
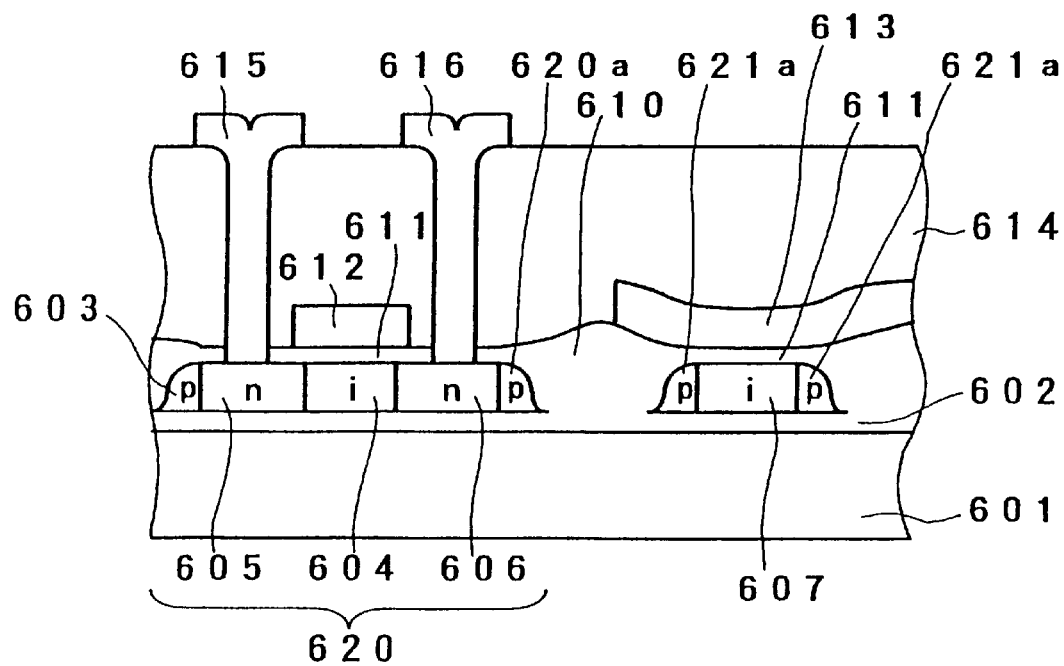
FIG. 8 is a cross-sectional view taken along the II–II' line of FIG. 7.
Figure 9:
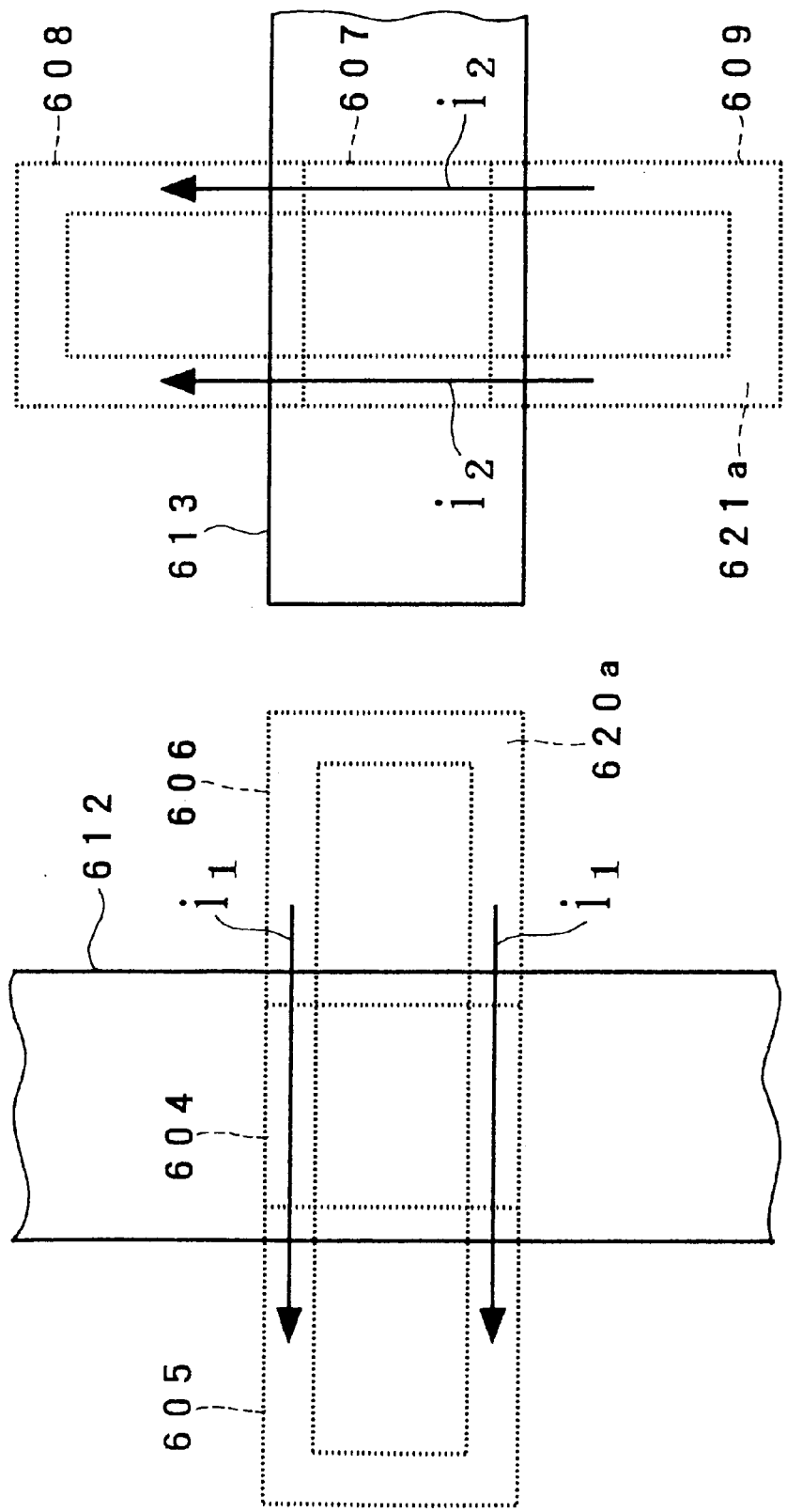
FIG. 9 is a plan view illustrating a leak current which occurs in the conventional semiconductor device.

As explained above, the semiconductor device according to the embodiment of the invention can effectively restrain a leak current between the source and the drain in the n-channel MOSFETs 120, 121 by using p$^+$-type impurity region 111 formed in the single crystal silicon substrate 101 and by making the p-type impurity regions 120a, 121a in the single crystal silicon layer 103. Moreover, by controlling the potential of the p$^+$-type impurity region 111, the embodiment can reinforce the element-isolating function for isolating the n-channel MOSFETs 120 and 121 from each other as compared with the conventional element isolation relying on the field oxidation film 110 alone (see FIG. 7).

The manufacturing methods for manufacturing semiconductor devices, taken as embodiments of the invention, can make both the p-type impurity regions 120a, 121aand the p$^+$-type impurity regions 111 simultaneously by a single ion implantation process, and hence reduces steps in the manufacturing process. It contributes to a reduction in manufacturing cost of semiconductor devices.

Although the embodiments have boon shown and described as making n-channel MOSFETs in the semiconductor substrate, the invention can of course be applied to making p-channel MOSFETs as well.

It should also be noted that the embodiments shown and described as using the semiconductor substrate and the semiconductor layer both made of single crystal silicon may be modified to make the substrate and the layer of polycrystalline silicon or of another appropriate semiconductor material such as GaAs.

Typical manufacturing methods of SOI substrate are as follows:

1. Oxygen is implanted in a silicon substrate with a high dose and an annealing is performed in high temperature of 1300° C. or more.

2. Two silicon substrates are prepared and one of them is oxidized, then they are adhered with the oxidation film is placed therebetween, and the adhered substrate is annealed.

The LOCOS method used for isolation of elements in the described embodiments may be replaced by another method to attain similar effects of the invention in case of semiconductor devices in which the film is thinner in outer marginal portions of device regions. For example, also when etching is used for making device regions, it can achieve the effects of the invention for semiconductor devices in which the thickness of device regions become thinner and thinner toward their outer extremities.

As explained above in detail, the present invention in form of semiconductor devices and their manufacturing methods can provide inexpensive semiconductor devices with less malfunctions.

What is claimed is:

1. A semiconductor device comprising:

a composite substrate comprising a semiconductor substrate, and a semiconductor layer on said semiconductor substrate with a dielectric layer interposed therebetween;

a plurality of element regions provided in said semiconductor layer and each having a field-effect transistor having a source and a drain of a first conduction type;

an element isolating insulation film made by substitution in part of said semiconductor layer surrounding said element regions;

first impurity-diffused regions of a second conduction type formed in outer marginal portions of said element regions in said semiconductor layer, said outer marginal portions being adjacent to said element isolating insulation film; and a second impurity-diffused region of the second conduction type formed along a selective surface portion of said semiconductor substrate that extends under said element isolating insulation film lying between said element regions and under said marginal portions of said element regions adjacent to said element isolating insulation film.

2. The semiconductor device according to claim 1, wherein said second impurity-diffused region has an impurity concentration higher than that of said first impurity-diffused regions.

3. The semiconductor device according to claim 1, wherein said first conduction type is an n-type and said second conduction type is a p-type.

4. The semiconductor device according to claim 3, wherein ground level or negative voltage is applied to said impurity diffused region.

5. A semiconductor device comprising:
- a composite substrate comprising a semiconductor substrate, and a semiconductor layer on said semiconductor substrate with a dielectric layer interposed therebetween;
- a plurality of element regions provided in said semiconductor layer and each having a field-effect transistor having a source and a drain of a first conduction type;
- an element isolating insulation film made by substitution in part of said semiconductor layer surrounding said element regions;
- first impurity-diffused regions of a second conduction type formed in outer marginal portions of said element regions in said semiconductor layer, said outer marginal portions being adjacent to said element isolating insulation film; and
- a second impurity-diffused region of the second conduction type formed along a selective surface portion of said semiconductor substrate that extends under said element isolating insulation film lying between said element regions and under said marginal portions of said element regions adjacent to said element isolating insulating film;
- wherein said second impurity-diffused region has an impurity concentration higher than that of said first impurity-diffused regions,
- said second impurity-diffused region having a impurity concentration profile in which a peak concentration exists in said semiconductor substrate.

6. The semiconductor device according to claim 5, wherein said first conduction type is a p-type and said second conduction type is an n-type.

7. The semiconductor device according to claim 6, wherein an impurity contained in said first and second impurity-diffused regions of the first conduction type is boron.

8. The semiconductor device according to claim 5, wherein an impurity contained in said first and second impurity-diffused regions of the first conduction type is boron.

9. A semiconductor device comprising a composite substrate comprising a semiconductor substrate, a semiconductor layer on said semiconductor substrate with a dielectric layer interposed therebetween, a field-effect transistor provided in each of a plurality of element regions of said semiconductor layer, and an element isolating insulation film, said semiconductor device formed by the process comprising the steps of:

providing said plurality of element regions in said semiconductor layer, each of said plurality of element regions having the respective field-effect transistor having a source and a drain of a first conduction type;

forming the element isolating insulation film by substitution in part of said semiconductor layer surrounding said element regions;

forming first impurity-diffused regions of a second conduction type in outer marginal portions of said element regions in said semiconductor layer, said outer marginal portions being adjacent to said element isolating insulation film; and forming a second impurity-diffused region of the second conduction type along a selective surface portion of said semiconductor substrate that extends under said element isolating insulation film lying between said element regions and under said marginal portions of said element regions adjacent to said element isolating insulating film;

wherein said second impurity-diffused region has an impurity concentration higher than that of said first impurity-diffused regions, said second impurity-diffused region having an impurity concentration profile in which a peak concentration exists in said semiconductor substrate.

10. The semiconductor device according to claim 9, wherein said first conduction type is a p-type and said second conduction type is an n-type.

* * * * *